US012593657B2

(12) United States Patent
Matsubara et al.

(10) Patent No.: US 12,593,657 B2
(45) Date of Patent: Mar. 31, 2026

(54) METHOD FOR MANUFACTURING SEMICONDUCTOR DEVICE BY REMOVING CARRIER AFTER FORMING RE-DISTRIBUTION LAYER

(71) Applicant: Resonac Corporation, Tokyo (JP)

(72) Inventors: Hiroaki Matsubara, Tokyo (JP); Daisuke Ikeda, Tokyo (JP); Keisuke Okawara, Tokyo (JP); Shogo Sobue, Tokyo (JP); Saeko Ogawa, Tokyo (JP)

( * ) Notice: Subject to any disclaimer, the term of this patent is extended or adjusted under 35 U.S.C. 154(b) by 341 days.

(21) Appl. No.: 18/255,383

(22) PCT Filed: Dec. 2, 2021

(86) PCT No.: PCT/JP2021/044312
§ 371 (c)(1),
(2) Date: Jun. 1, 2023

(87) PCT Pub. No.: WO2022/118925
PCT Pub. Date: Jun. 9, 2022

(65) Prior Publication Data
US 2024/0006222 A1     Jan. 4, 2024

(30) Foreign Application Priority Data

Dec. 4, 2020     (WO) .................. PCT/JP2020/045338

(51) Int. Cl.
*H01L 21/683*     (2006.01)
*H01L 21/56*     (2006.01)
(Continued)

(52) U.S. Cl.
CPC ........ *H01L 21/6836* (2013.01); *H01L 21/561* (2013.01); *H01L 21/60* (2021.08);
(Continued)

(58) Field of Classification Search
CPC ... H01L 21/6836; H01L 21/561; H01L 21/60; H01L 24/97; H01L 2021/6006;
(Continued)

(56) References Cited

U.S. PATENT DOCUMENTS

| | | | | |
|---|---|---|---|---|
| 2002/0074641 A1* | 6/2002 | Towle | ..................... | H01L 24/24 257/692 |
| 2005/0122698 A1* | 6/2005 | Ho | .......................... | H01L 24/19 361/764 |
| 2017/0018626 A1* | 1/2017 | Hoffman | .............. | C12Q 1/6869 |

FOREIGN PATENT DOCUMENTS

| | | | |
|---|---|---|---|
| CN | 203983326 U | * | 12/2014 |
| JP | 2003-306653 | | 10/2003 |

(Continued)

OTHER PUBLICATIONS

International Preliminary Report on Patentability with Written Opinion dated Jun. 15, 2023 for PCT/JP2020/045338.
(Continued)

*Primary Examiner* — Duy T Nguyen
(74) *Attorney, Agent, or Firm* — SHIPWAY IP

(57) ABSTRACT

A method for manufacturing a semiconductor device includes preparing a temporary fixing structure body in which semiconductor elements each including a first surface on which a connection terminal is formed and a second surface are attached to a temporary fixing material, forming a curable bonding adhesive layer on the second surface of each of the semiconductor elements, attaching a carrier to one surface of the curable bonding adhesive layer opposite to the semiconductor elements, fixing the semiconductor elements to the carrier by curing the curable bonding adhesive layer, and removing the temporary fixing material. The semiconductor elements are attached onto the temporary fixing material such that the first surface of each of the semiconductor elements is directed toward the temporary (Continued)

fixing material, and are encapsulated with an encapsulant material such that the second surface of each of the semiconductor elements is exposed from an encapsulant material layer.

19 Claims, 7 Drawing Sheets

(51) Int. Cl.
  *H01L 21/60*        (2006.01)
  *H01L 23/00*        (2006.01)
(52) U.S. Cl.
  CPC ...... *H01L 24/97* (2013.01); *H01L 2021/6006* (2013.01); *H01L 2221/68327* (2013.01); *H01L 2221/68363* (2013.01); *H01L 2224/97* (2013.01)
(58) Field of Classification Search
  CPC . H01L 2221/68327; H01L 2221/68363; H01L 2224/97; H01L 23/295; H01L 23/3128; H01L 23/3171; H01L 2221/68345; H01L 21/6835; H01L 21/568; H01L 23/12
  USPC ........................................................ 438/107
  See application file for complete search history.

(56)                References Cited

FOREIGN PATENT DOCUMENTS

| JP | 2013-168594 |     | 8/2013 |
| JP | 2017-152617 |     | 8/2017 |
| JP | 2017152617 A | * | 8/2017 |
| JP | 2018-009138 |     | 1/2018 |
| JP | 2019-033124 |     | 2/2019 |
| JP | 2019-129179 |     | 8/2019 |
| JP | 7226669 |     | 2/2023 |
| TW | 201826413 |     | 7/2018 |

OTHER PUBLICATIONS

International Preliminary Report on Patentability with Written Opinion dated Jun. 15, 2023 for PCT/JP2021/044312.
International Search Report dated Mar. 2, 2021 for PCT/JP2020/045338.
International Search Report dated Feb. 8, 2022 for PCT/JP2021/044312.

* cited by examiner

*Fig.6A*
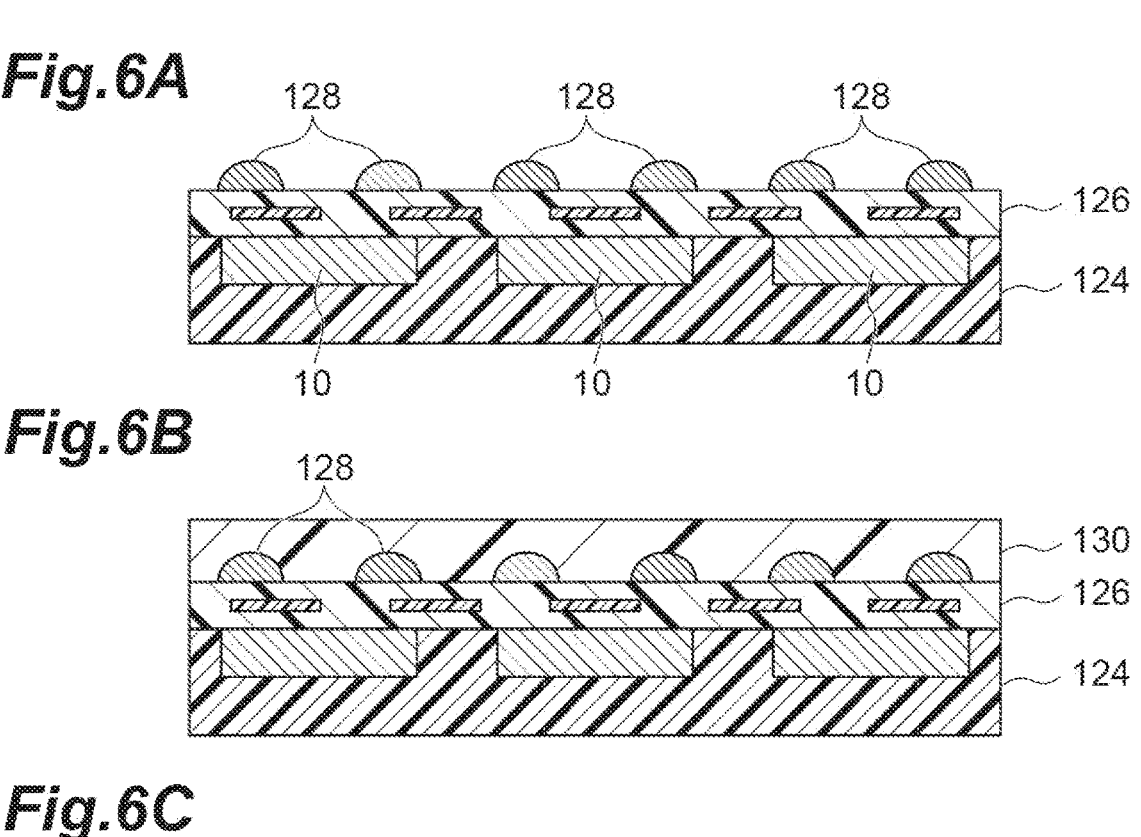
*Fig.6B*
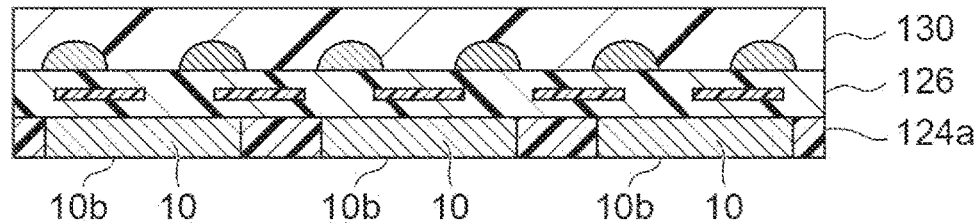
*Fig.6C*
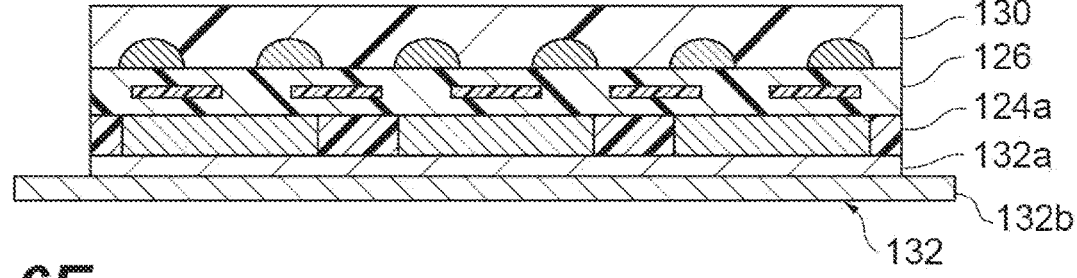
*Fig.6D*
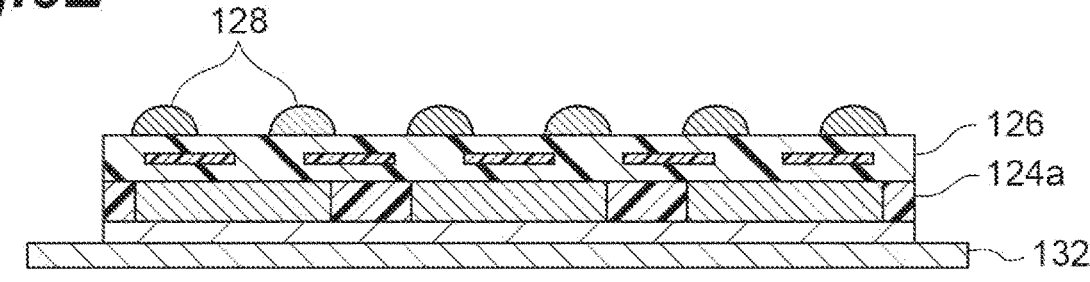
*Fig.6E*

128

126
124a
132a
132b

L 101          101          101

S          S

101

101

METHOD FOR MANUFACTURING SEMICONDUCTOR DEVICE BY REMOVING CARRIER AFTER FORMING RE-DISTRIBUTION LAYER

CROSS-REFERENCE TO RELATED APPLICATIONS

This application is a 35 U.S.C. § 371 national phase application of PCT/JP2021/044312, filed on Dec. 2, 2021, which claims priority to International Patent Application No. PCT/JP2020/045338, filed on Dec. 4, 2020.

TECHNICAL FIELD

The present disclosure relates to a method for manufacturing a semiconductor device.

BACKGROUND ART

In Patent Literature 1, a thermally peelable adhesive sheet used for manufacturing a semiconductor device is disclosed.

CITATION LIST

Patent Literature

Patent Literature 1: Japanese Unexamined Patent Publication No. 2003-306653

SUMMARY OF INVENTION

Technical Problem

As one method for manufacturing a semiconductor device, a fan-out package is known. In the fan-out package, singulated semiconductor chips (dies) are arranged on different wafers and encapsulated to be a redisposition wafer, and then, a re-distribution layer (RDL) is formed, and each semiconductor device is manufactured. In such a fan-out package method, for example, as illustrated in FIGS. 5A-when a semiconductor elements 10 are redisposed, the semiconductor elements 10 are once attached to a temporary fixing material 120 (for example, refer to Patent Literature 1), and then, are encapsulated, and the temporary fixing material 120 is removed after the encapsulating is ended. However, warpage or distortion may occur in a die redisposition body in which the semiconductor elements are encapsulated (for example, refer to FIG. 5D) when the temporary fixing material is removed, the flatness of the die redisposition body may be degraded.

An object of the present disclosure is to provide a method for manufacturing a semiconductor device for improving the flatness of a die redisposition body.

Solution to Problem

As one aspect, the present disclosure relates to a method for manufacturing a semiconductor device. The method for manufacturing a semiconductor device includes preparing a temporary fixing structure body in which a plurality of semiconductor elements each including a first surface on which a connection terminal is formed and a second surface on a side opposite to the first surface are attached to a temporary fixing material, forming a curable bonding adhesive layer on the second surface of each of the plurality of semiconductor elements, attaching a carrier to one surface of the curable bonding adhesive layer on a side opposite to the plurality of semiconductor elements, fixing the plurality of semiconductor elements to the carrier by curing the curable bonding adhesive layer through the cured curable bonding adhesive layer, and removing the temporary fixing material. In the temporary fixing structure body, the plurality of semiconductor elements are attached to the temporary fixing material such that the first surface of each of the plurality of semiconductor elements is directed toward the temporary fixing material, and the plurality of semiconductor elements are encapsulated with an encapsulant material such that the second surface of each of the plurality of semiconductor elements is exposed from an encapsulant material layer.

In this manufacturing method, the carrier is fixed to the surface of the temporary fixing structure body on a side opposite to the temporary fixing material through the curable bonding adhesive layer. Then, the temporary fixing material is removed in a state where the carrier is fixed. In this case, the warpage or the distortion of a die redisposition body, which occurs when the temporary fixing material is removed, is suppressed by the carrier, and thus it is possible to improve the flatness of the die redisposition body. As with the method described above, by improving the flatness of the die redisposition body, for example, in a case where a re-distribution layer or the like is formed on the connection terminal side of the semiconductor element, it is possible to form a finer re-distribution layer or the like.

In the manufacturing method described above, the carrier may be a glass substrate, and a bonding adhesive strength of the curable bonding adhesive layer to the glass substrate may be 1 MPa or more when the curable bonding adhesive layer is cured, and may be 5 MPa or less when the curable bonding adhesive layer is irradiated with laser. By setting the bonding adhesive strength of the curable bonding adhesive layer to the glass substrate to 1 MPa or more when the curable bonding adhesive layer is cured, it is possible to more rigidly fix the semiconductor element to the carrier, and to reduce the displacement of the semiconductor element. In addition, by setting the bonding adhesive strength of the curable bonding adhesive layer to the glass substrate to 5 MPa or less when the curable bonding adhesive layer is irradiated with the laser, it is possible to simply remove the carrier by laser irradiation when removing the carrier, and to improve a working efficiency.

In the manufacturing method described above, the curable bonding adhesive layer may include a resin composition containing a thermoplastic resin and an epoxy curing agent, and a glass transition temperature of the thermoplastic resin may be −40° C. or higher and 40° C. or lower. In this case, it is possible to reduce warpage after package completion. The curable bonding adhesive layer may contain a light absorbing agent, or may have optical absorption properties. The light absorbing agent or the optical absorption properties, for example, may absorb light at 193 nm or more and 351 nm or less, which are wavelength bands of excimer laser that is one type of UV laser. Examples of the excimer laser may include XeF excimer laser (a wavelength of 351 nm), XeCl excimer laser (a wavelength of 303 nm), KrF excimer laser (a wavelength of 248 nm), ArF excimer laser (a wavelength of 193 nm), and the like. In addition, YAG laser (a triple wave) (a wavelength of 355 nm), YAG laser (a quadruple wave) (a wavelength of 266 nm), and the like, which are other UV laser beams, may be used.

In the manufacturing method described above, a thickness of the curable bonding adhesive layer may be 1 μm or more and 400 μm or less after curing. By setting the thickness of the curable bonding adhesive layer to 1 μm or more, it is possible to reliably fix the carrier to the temporary fixing structure body by the cured curable bonding adhesive layer, to reliably suppress the warpage or the distortion of the die redisposition body when the temporary fixing material is removed, and to improve the flatness. In addition, since the carrier is capable of reliably retaining the plurality of semiconductor elements by the curable bonding adhesive layer having such a thickness, it is possible to reduce the displacement of the semiconductor element. On the other hand, by setting the thickness of the curable bonding adhesive layer to 400 μm or less, it is possible to reduce the height of the semiconductor device to be manufactured.

In the manufacturing method described above, it is preferable that the carrier is a glass substrate or a transparent resin substrate, and a thickness thereof is 0.1 mm or more and 2.0 mm or less. In this case, it is possible to more reliably prevent the warpage or the distortion of the die redisposition body by the carrier. In addition, in the state of suppressing the displacement of the plurality of semiconductor elements or the like retained by such a carrier, for example, it is possible to perform a step of forming a re-distribution layer, or the like, and to prepare the semiconductor device of which the height is further reduced with an excellent accuracy.

The manufacturing method described above may further include forming a re-distribution layer on the first surface of each of the plurality of semiconductor elements fixed to the carrier in a state in which the plurality of semiconductor elements are fixed to the carrier. In the fan-out method of the related art, since the semiconductor element is attached to the carrier by an adhesive layer, or the rigid temporary fixing material is removed in the middle, the flatness of the surface of the encapsulant material and the semiconductor element encapsulated with the encapsulant material is degraded, and it is difficult to form a fine re-distribution layer. In contrast, according to this manufacturing method, the temporary fixing material is removed in a state where the plurality of semiconductor elements are attached onto the carrier, and thus it is possible to increase the flatness of the surface of the encapsulant material and the semiconductor element encapsulated with the encapsulant material. Therefore, according to this manufacturing method, it is possible to form a fine re-distribution layer.

The manufacturing method described above may further include attaching a solder ball to the connection terminal of each of the plurality of semiconductor elements or the re-distribution layer in a state in which the plurality of semiconductor elements are fixed to the carrier. In this case, the solder ball is attached to the semiconductor element or the re-distribution layer in the die redisposition body of which the flatness is improved, and thus it is possible to attach the solder ball with an excellent accuracy.

The manufacturing method described above may further include removing the carrier, and it is preferable that the carrier is a light transmissive substrate, and the curable bonding adhesive layer contains a light absorbing agent, and in the removing of the carrier, the carrier is removed by irradiating the cured curable bonding adhesive layer with laser light from the carrier side. In this case, it is possible to simplify the work of removing the carrier. According to such a laser light treatment, it is also possible to increase the flatness or the cleanliness of the surface from which the carrier is removed.

In the manufacturing method described above, in the removing of the carrier, the carrier may be removed by applying laser light such that peeling energy for peeling off the carrier is 1 kW/cm² or more and 200 kW/cm² or less. In this case, the carrier can be removed with low energy, and thus it is possible to minimally suppress a heat damage to the semiconductor element or the like, and to minimally suppress the dust generated after the laser irradiation. In addition, the laser to be applied has low energy, and thus it is possible to shorten the time required for removing the carrier. A laser type used for the peeling is not limited.

The manufacturing method described above may further include removing the carrier, and in the removing of the carrier, the carrier may be removed by scraping or melting the carrier.

The manufacturing method described above may further include cleaning an exposed surface of either the cured curable bonding adhesive layer or the encapsulant material layer of the encapsulant material after the removing of the carrier. In this case, it is possible to make the surface of the semiconductor device to be manufactured cleaner to have excellent visual quality.

The manufacturing method described above may further include singulating the plurality of semiconductor elements after the removing of the carrier. In this case, since various steps are performed while the plurality of semiconductor elements are retained on the carrier until the plurality of semiconductor elements are singulated into each of the semiconductor devices including the semiconductor element, it is not necessary to use various protective layers (a BG tape and the like) used in the related art, and it is possible to reduce the manufacturing step or to reduce the manufacturing cost. In this case, in the singulating of the plurality of semiconductor elements, the cured curable bonding adhesive layer may be singulated together with the plurality of semiconductor elements, and the semiconductor device may be acquired from each of the plurality of semiconductor elements in which the second surface is protected with the curable bonding adhesive layer.

In the manufacturing method described above, the preparing of the temporary fixing structure body may include preparing the temporary fixing material, attaching the plurality of semiconductor elements to the temporary fixing material such that the first surface of each of the plurality of semiconductor elements is directed toward the temporary fixing material, and encapsulating the plurality of semiconductor elements with the encapsulant material such that the second surface of each of the plurality of semiconductor elements attached to the temporary fixing material is exposed from the encapsulant material layer.

In the manufacturing method described above, in the preparing of the temporary fixing structure body, the temporary fixing structure body in which a plurality of electronic components are attached to the temporary fixing material together with the plurality of semiconductor elements may be prepared, and in the fixing of the plurality of semiconductor elements, the plurality of electronic components may be fixed to the carrier by curing the curable bonding adhesive layer. In this case, it is possible to improve the flatness of the die redisposition body also including the electronic component, and to prepare a more complicated semiconductor device by a simple method.

In the manufacturing method described above, a bonding adhesive strength between the cured curable bonding adhesive layer and the encapsulant material may be 4.0 MPa or more. In this case, it is possible to keep the bonding adhesive strength between the curable bonding adhesive layer and the encapsulant material strong, to prevent peeling after package assembly, and to allow the curable bonding adhesive layer to function as it is as a part of the final product of the semiconductor device. In this case, the bonding adhesive strength between the cured curable bonding adhesive layer and the encapsulant material may be 8.0 MPa or less. The bonding adhesive strength between the cured curable bonding adhesive layer and the encapsulant material may be 20 MPa or more. In this case, it is possible to keep the bonding adhesive strength between the curable bonding adhesive layer and the encapsulant material stronger, to prevent the peeling after the package assembly, and to allow the curable bonding adhesive layer to function as it is as a part of the final product of the semiconductor device.

In the manufacturing method described above, a bonding adhesive strength between the cured curable bonding adhesive layer and the plurality of semiconductor elements may be 4.0 MPa or more. In this case, it is possible to keep the bonding adhesive strength between the curable bonding adhesive layer and the plurality of semiconductor elements (for example, silicon chips) strong, to prevent the peeling after the package assembly, and to allow the curable bonding adhesive layer to function as it is as a part of the final product of the semiconductor device.

In the manufacturing method described above, the semiconductor device in a state in which the cured curable bonding adhesive layer protects the second surface of each of the plurality of semiconductor elements may be acquired. In this case, it is possible to allow the curable bonding adhesive layer to function as it is as a part of the final product of the semiconductor device.

Advantageous Effects of Invention

According to one aspect of the present disclosure, it is possible to improve the flatness of the die redisposition body in the manufacturing of the semiconductor device.

BRIEF DESCRIPTION OF DRAWINGS

FIGS. 6A to 6E are diagrams illustrating steps that are the method for manufacturing a semiconductor device and are subsequently performed after steps of FIGS. 5A-5E.

DESCRIPTION OF EMBODIMENTS

Figure 1:
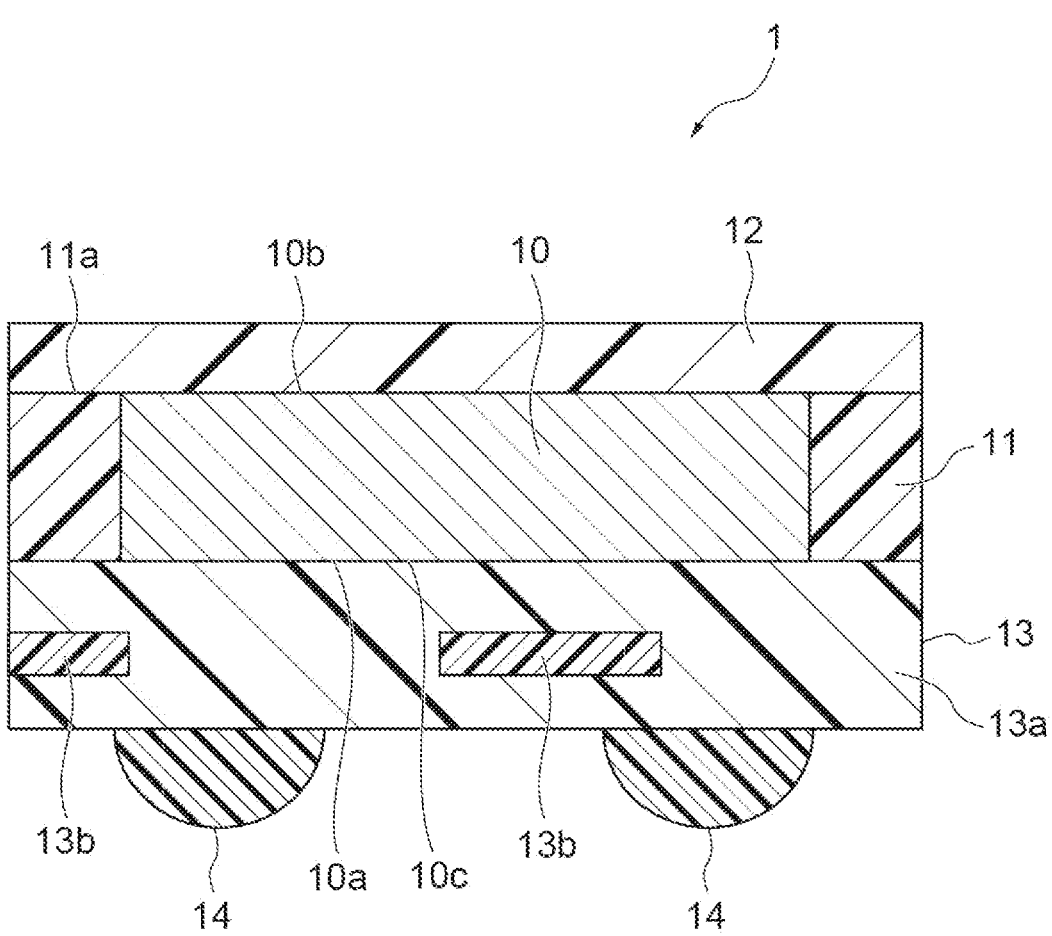
FIG. 1 is a sectional view illustrating an example of a semiconductor device to be manufactured by a method according to one embodiment of the present disclosure.

Hereinafter, several embodiments of the present disclosure will be described in detail, with reference to the drawings, as necessary. The present disclosure is not limited to the following embodiments. In the following description, the same reference numerals will be applied to the same or corresponding parts, and the repeated description will be omitted. A positional relationship such as the left, right, top, and bottom is based on a positional relationship illustrated in the drawings, unless otherwise specified. A dimension ratio in the drawings is not limited to the illustrated ratio.

In this specification, the term "layer" includes not only a structure in which a layer is formed on the entire surface but also a structure in which a layer is formed on a part of the surface when observed as a plan view. In this specification, the term "step" includes not only an independent step but also a step that is not explicitly distinguishable from other steps insofar as a desired function of the step is attained.

In this specification, a numerical range represented by using "to" indicates a range including numerical values described before and after "to" as the minimum value and the maximum value, respectively. In a numerical range described in a stepwise manner in this specification, the upper limit value or the lower limit value of the numerical range in a certain step may be replaced with the upper limit value or the lower limit value of the numerical range in another step. In the numerical range described in this specification, the upper limit value or the lower limit value of the numerical range may be replaced with a value described in Examples.

(Configuration of Semiconductor Device)

FIG. 1 is a sectional view schematically illustrating an example of a semiconductor device to be manufactured by a manufacturing method according to this embodiment. As illustrated in FIG. 1, a semiconductor device 1, for example, is a device having a fan-out structure, and includes a semiconductor element 10, an encapsulant material layer 11, a protective layer 12, a re-distribution layer 13, and solder balls 14. The semiconductor device 1, for example, is prepared by a fan-out package (FO-PKG) technology, and for example, may be prepared by a fan-out wafer level package (FO-WLP) technology or may be prepared by a fan-out panel level package (FO-PLP) technology. The encapsulant material layer 11 is a layer in which the semiconductor element 10 is encapsulated with an encapsulant material such as a resin. The protective layer 12 is a layer protecting the semiconductor element 10, and is a cured layer disposed on a second surface 10b of the semiconductor element 10 and a surface 11a of the encapsulant material layer 11. The protective layer 12 is formed by curing a curable bonding adhesive layer 26 described below (refer to FIGS. 2A-2D and FIGS. 3A-3E). The protective layer 12 is fixed to the second surface 10b of the semiconductor element 10 and the encapsulant material layer 11 such that peeling does not occur, and a bonding adhesive strength between the second surface 10b of the semiconductor element 10 and the surface 11a of the encapsulant material layer 11, and the protective layer 12, for example, may be 4.0 MPa or more. The re-distribution layer 13 is a layer widening a terminal pitch of a connection terminal 10c on a first surface 10a side of the semiconductor element 10, and for example, includes an insulating portion 13a such as polyimide and a wiring portion 13b such as copper wiring. The solder ball 14 is connected to the terminal of which the terminal pitch is widened by the re-distribution layer 13 such that the connection terminal 10c of the semiconductor element 10 is pitch-converted (widened) and connected to the solder ball 14.

(Method for Manufacturing Semiconductor Device)

Next, a method for manufacturing the semiconductor device 1 will be described with reference to FIGS. 2A-2D to FIGS. 4A-4E. FIGS. 2A-2D to FIGS. 4A-4E are diagrams sequentially illustrating the method for manufacturing the semiconductor device 1. In the method for manufacturing a semiconductor device, first, a plurality of semiconductor elements 10 each including the first surface 10*a* on which the connection terminals 10*c* are formed and the second surface 10*b* on a side opposite to the first surface 10*a* are prepared (refer to FIG. 1 and FIG. 2B). The plurality of semiconductor elements 10, for example, are collectively formed by a general semiconductor process, and then, are singulated by dicing, and each of the semiconductor elements 10 is prepared. Since a method of the related art can be used in this preparing step, the description will be omitted.

Figure 2A:
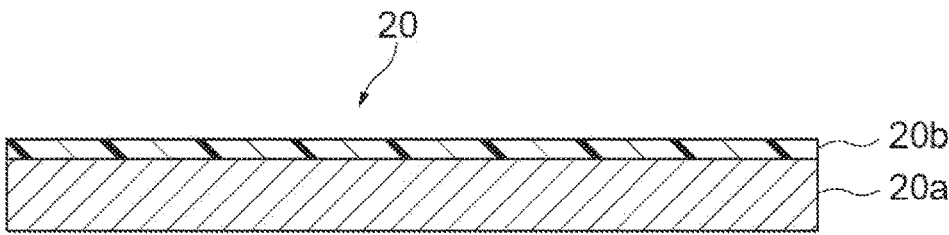
FIGS. 2A to 2D are diagrams illustrating a part of the method for manufacturing the semiconductor device illustrated in FIG. 1.
Figure 2B:
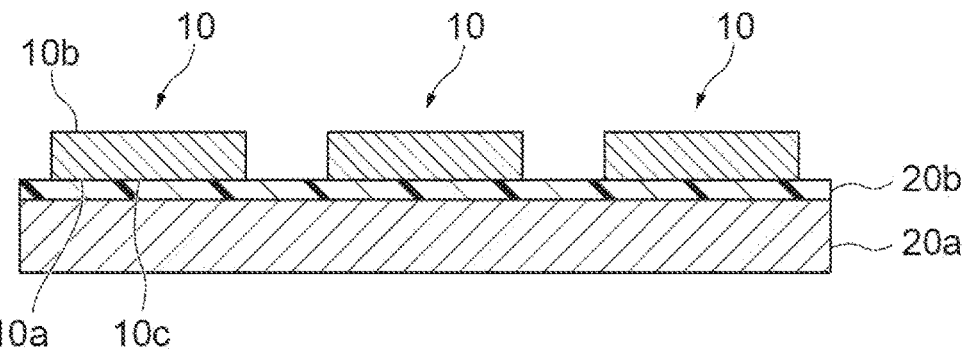
Figure 2C:
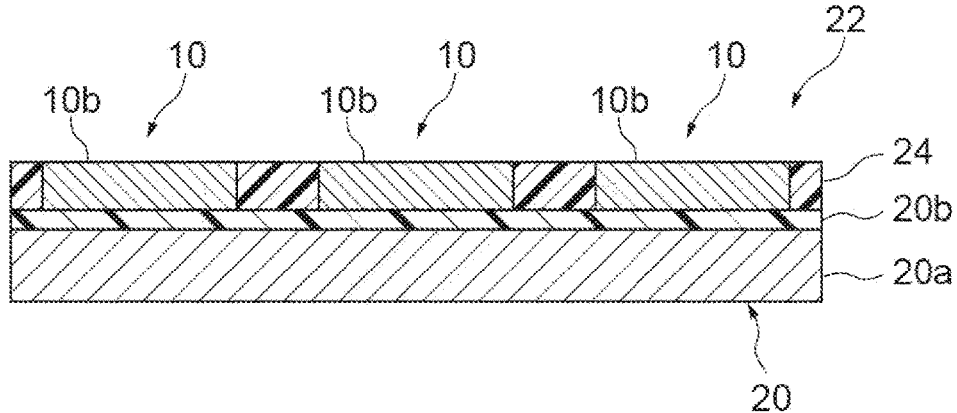

As illustrated in FIG. 2A, an adhesive layer 20*b* is provided on a metallic carrier 20*a* to prepare a temporary fixing material 20. As the adhesive layer 20*b*, for example, a peeling sheet having an adhesive force at an ordinary temperature, in which the adhesive force is decreased by heating, and the like can be used. The carrier 20*a* may be in the shape of a disc wafer when seen from a plan view, or may be in the shape of a rectangular panel. Then, as illustrated in FIG. 2B, the plurality of semiconductor elements 10 are disposed on the adhesive layer 20*b* of the temporary fixing material 20 such that the first surfaces 10*a* and the connection terminals 10*c* of the plurality of semiconductor elements 10 are directed toward the adhesive layer 20*b* (that is, face-down). After that, as illustrated in FIG. 2C, the semiconductor elements 10 are encapsulated with an encapsulating resin (an encapsulant material) such as epoxy to form an encapsulant material layer 24. When the encapsulant material layer 24 is formed, the encapsulating is performed such that the second surfaces 10*b* of the semiconductor elements 10 are exposed from the encapsulant material layer 24. Accordingly, a temporary fixing structure body 22 is formed in which the plurality of semiconductor elements 10 are attached onto the temporary fixing material 20 such that the first surface 10*a* of each of the plurality of semiconductor elements 10 is directed toward the temporary fixing material 20, and the plurality of semiconductor elements 10 are encapsulated with the encapsulant material such that the second surface 10*b* of each of the plurality of semiconductor elements 10 is exposed from the encapsulant material layer 24. The temporary fixing structure body 22 may be formed by encapsulating the semiconductor elements 10 to cover the semiconductor elements 10 with the encapsulant material and then grinding the encapsulant material such that the second surfaces 10*b* are exposed.

Figure 2D:
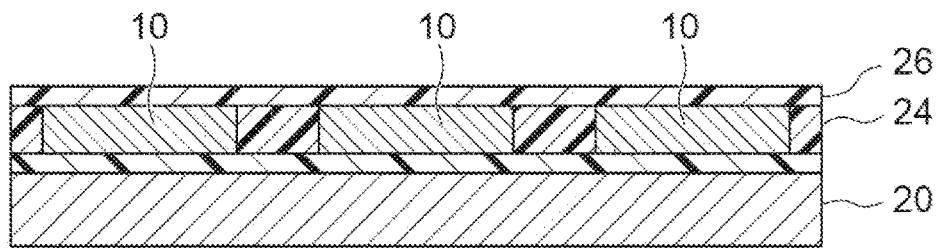
Figures 3A, 3B, 3C, 3D, 3E:
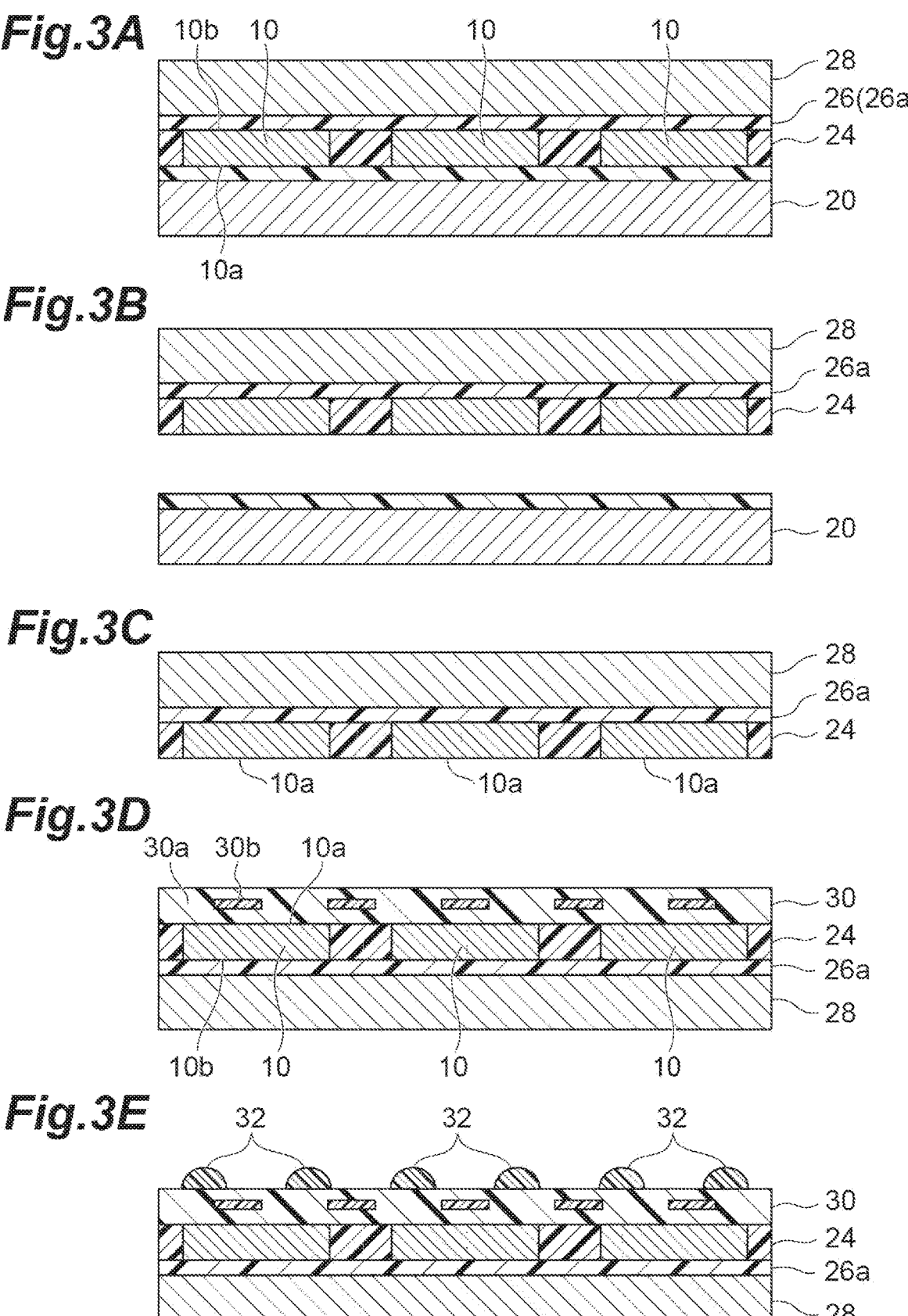
FIGS. 3A to 3E are diagrams illustrating steps that are the method for manufacturing the semiconductor device illustrated in FIG. 1 and are subsequently performed after steps of FIGS. 2A-2D.

Subsequently, in a case where the temporary fixing structure body 22 is formed (prepared), as illustrated in FIG. 2C and FIG. 2D, the curable bonding adhesive layer 26 is formed on the encapsulant material layer 24 from which the second surfaces 10*b* of the semiconductor elements 10 are exposed. Then, as illustrated in FIG. 3A, a carrier 28 having light transmissivity, such as a glass substrate, is attached onto the curable bonding adhesive layer 26, and the curable bonding adhesive layer 26 is cured by at least one of heat and light to be a cured layer 26*a*. Accordingly, the plurality of semiconductor elements 10 and the encapsulant material layer 24 are fixed to the carrier 28 through the cured layer 26*a*. In this case, a bonding adhesive strength between the plurality of semiconductor elements 10 and the encapsulant material layer 24, and the cured layer 26*a*, for example, may be 4.0 MPa or more, 20 MPa or more, or 8.0 MPa or less. In this manufacturing method, the thickness of the carrier 28, for example, is 0.1 mm or more and 2.0 mm or less, because various steps after this step are performed on the carrier 28 until the semiconductor elements 10 attached onto the die redisposition body are singulated again. However, the thickness of the carrier 28 is not limited thereto. It is preferable that the carrier 28 is a glass substrate, and may be a transparent resin substrate having light transmissivity. The carrier 28 may be in the shape of a disc wafer, or may be in the shape of a rectangular panel.

The curable bonding adhesive layer 26, for example, can include a member (a curable resin film) in which a resin composition that is a curable bonding adhesive agent is formed into the shape of a film, and can be a member for fixing the plurality of semiconductor elements 10 and the encapsulant material layer 24 to the carrier 28 by being attached to the encapsulant material layer 24, and then, by being cured. The curable bonding adhesive agent configuring the curable bonding adhesive layer 26 is a bonding adhesive agent cured by at least one of heat and light, and for example, is a resin composition containing a thermoplastic resin and an epoxy curing agent. The thermoplastic resin contained in the curable bonding adhesive agent has a glass transition temperature of −40° C. or higher and 40° C. or lower. Such a curable bonding adhesive layer 26 may be configured in advance such that the thickness after curing, for example, is 1 μm or more and 400 μm or more. The curable resin film configuring the curable bonding adhesive layer 26 may have tackiness at 25° C., and more specifically, may have tackiness to the extent of being attached to the glass substrate in the environment of 25° C. A bonding adhesive strength of the curable bonding adhesive layer 26 to the carrier 28 may be 1 MPa or more in a case where the curable bonding adhesive layer 26 is cured, and may be 5 MPa or less in a case where the curable bonding adhesive layer 26 is irradiated with laser.

It is preferable that the curable bonding adhesive layer 26 is a portion to be heated by laser irradiation in a laser peeling step described below (refer to FIG. 4A), and the resin composition contains a light absorbing agent absorbing laser light. In a case where the curable bonding adhesive layer 26 is a curable resin film containing the light absorbing agent, the curable bonding adhesive layer 26 has sufficiently low light transmissivity. As the light absorbing agent contained in the curable bonding adhesive layer 26, a material absorbing laser light of excimer laser to produce heat may be selected, and for example, a black pigment or dye, and the like may be added. Specific examples of the light absorbing agent include carbon black, aluminum, nickel, and titanium oxide. The content of the light absorbing agent, for example, can be in a range in which the transmittance of the curable resin film configuring the curable bonding adhesive layer 26 with respect to light at a wavelength of 351 nm is 20% or less. Specifically, the content of the light absorbing agent may be 1% by mass or more and 30% by mass or less, or 1% by mass or more and 20% by mass, on the basis of the mass of the curable bonding adhesive layer 26. Here, the transmittance indicates a ratio of the intensity of transmitted light to the intensity of incident light when light having a predetermined wavelength is incident on the curable bonding adhesive layer 26 from one main surface side.

The thermoplastic resin configuring the curable bonding adhesive layer 26 may have a reactive group. The reactive group of the thermoplastic resin, for example, may be an epoxy group. The thermoplastic resin may be a (meth) acrylic copolymer, or may be a (meth)acrylic copolymer having a reactive group. In this specification, "(meth)acryl" is used as the term indicating acryl or methacryl. The same applies to other similar expressions.

The (meth)acrylic copolymer is a copolymer containing a (meth)acrylic monomer having a (meth)acryloyl group, as a monomer unit. The (meth)acrylic copolymer may be a copolymer containing a (meth)acrylic monomer forming a homopolymer with a glass transition temperature of 50° C. or higher, a (meth)acrylic monomer forming a homopolymer with a glass transition temperature of 0° C. or lower, and a (meth)acrylic monomer having an epoxy group, as a monomer unit. A glass transition temperature of a homopolymer formed by the (meth)acrylic monomer having an epoxy group is not limited. The (meth)acrylic monomer forming the homopolymer with the glass transition temperature of 50° C. or higher and the (meth)acrylic monomer forming the homopolymer with the glass transition temperature of 0° C. or lower can be a monomer not having an epoxy group.

A weight average molecular weight of the thermoplastic resin configuring the curable bonding adhesive layer 26 may be 200000 or more and 1000000 or less. Here, the weight average molecular weight can be a value in terms of standard polystyrene, which is measured by gel permeation chromatography. The content of the thermoplastic resin may be 10% by mass or more and 80% by mass or less, on the basis of the mass of the film configuring the curable bonding adhesive layer 26.

The curable resin film configuring the curable bonding adhesive layer 26 may further contain a curable resin that is a compound having a reactive group. The curable resin may be an epoxy resin having two or more epoxy groups, and examples thereof include a bisphenol A-type epoxy resin, a bisphenol F-type epoxy resin, a phenol novolac-type epoxy resin, and a cresol novolac-type epoxy resin. A molecular weight of the curable resin may be 3000 or less. The curable bonding adhesive layer 26 containing the curable resin is likely to have curing properties and suitable tackiness. The content of the curable resin may be 1% by mass or more and 50% by mass or less, on the basis of the mass of the curable resin film configuring the curable bonding adhesive layer 26.

The curable bonding adhesive layer 26 may further contain a silica filler. The content of the silica filler may be 1% by mass or more and 60% by mass or less, or 5% by mass or more and 60% by mass or less, on the basis of the mass of the film configuring the curable bonding adhesive layer 26.

The curable bonding adhesive layer 26 may further contain a curing agent reacting with any one or both of the reactive group of the thermoplastic resin and the reactive group of the curable resin. The curing agent, for example, may be a phenolic resin. In a case where the curable bonding adhesive layer 26 contains the curing agent, the curable bonding adhesive layer 26 may further contain a curing accelerator accelerating the reaction of the curing agent. For example, in a case where the curing agent is the phenolic resin, the curing accelerator may be an imidazole compound.

Subsequently, in a case where the attaching of the carrier 28 is ended, as illustrated in FIG. 3B and FIG. 3C, a step of removing the temporary fixing material 20 from the encapsulant material layer 24 in which the plurality of semiconductor elements 10 are encapsulated is performed. In such a step, the temporary fixing material 20 is peeled off and removed by applying predetermined heat to the adhesive layer 20b of the temporary fixing material 20. According to such peeling and removing, the first surfaces 10a of the plurality of semiconductor elements 10 are exposed from the encapsulant material layer 24.

Subsequently, in a case where the temporary fixing material 20 is removed, as illustrated in FIG. 3D, in a state where the plurality of semiconductor elements 10 are fixed to the carrier 28 through the cured layer 26a, a re-distribution layer 30 is formed on the first surfaces 10a of the plurality of semiconductor elements 10 fixed to the carrier 28. FIG. 3D illustrates the configuration of FIG. 3C in a vertically flipped manner. The re-distribution layer 30 is a portion corresponding to the re-distribution layer 13 of the semiconductor device 1 described above, and includes an insulating layer portion 30a such as polyimide, and a wiring portion 30b in the insulating layer portion 30a, such as copper wiring. In the step of forming the re-distribution layer 30, the formation of the insulating layer and the formation of the wiring portion are repeated a predetermined number of times, and a wiring layer for pitch conversion is formed. In this manufacturing method, the re-distribution layer 30 is formed in a state where the semiconductor elements 10 and the encapsulant material layer 24 are stably disposed on the carrier 28, and thus a fine re-distribution layer is easily constructed.

Subsequently, in a case where the re-distribution layer is formed, as illustrated in FIG. 3E, solder balls 32 are formed such that the connection terminals 10c of the plurality of semiconductor elements 10 are connected to the solder balls 32 through the re-distribution layer 30 in a state where the plurality of semiconductor elements 10 are fixed to the carrier 28. In this case, the solder balls 32 is formed such that the pitch thereof is wider than the terminal pitch of the connection terminals 10c of the semiconductor elements 10. Such a solder ball 32 corresponds to the solder ball 14 in the semiconductor device 1 described above.

Figure 4A:
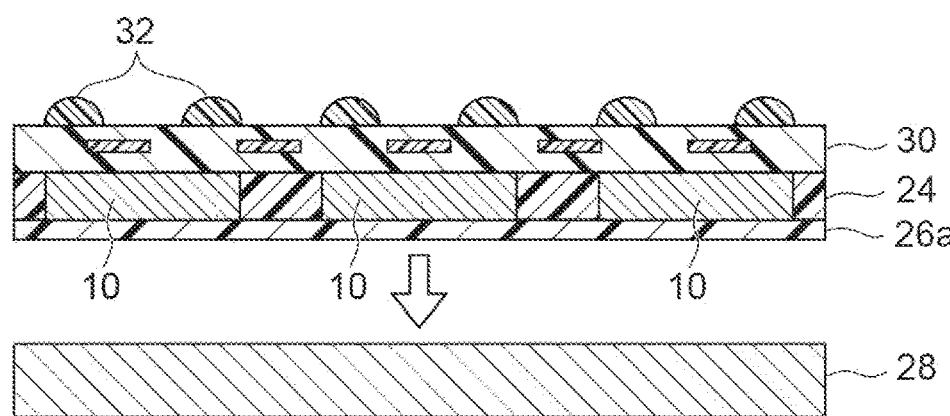
FIGS. 4A to 4E are diagrams illustrating steps that are the method for manufacturing the semiconductor device illustrated in FIG. 1 and are subsequently performed after the steps of FIGS. 3A-3E.

Subsequently, in a case where the attaching of the solder ball 32 is performed, laser marking is performed with respect to the cured layer 26a by irradiating the cured layer 26a with laser light from the carrier 28 side to write necessary information such as a product name, and as illustrated in FIG. 4A, the carrier 28 is removed from the cured layer 26a by the irradiation of the laser light. The laser used for removing the carrier 28, for example, is excimer laser that is one type of UV laser, and the transmittance of the carrier 28 including the glass substrate with respect to the laser light is 99% or more. More specifically, for example, by irradiating the cured layer 26a with laser light at a wavelength of 351 nm from the excimer laser, the light absorbing agent in the cured layer 26a produces heat, which causes peeling between the cured layer 26a and the carrier 28. The wavelength of the laser light applied to the cured layer 26a from the excimer laser may be 532 nm, or may be other wavelengths. For example, the laser used herein may be excimer laser such as XeF excimer laser (a wavelength of 351 nm), XeCl excimer laser (a wavelength of 303 nm), KrF excimer laser (a wavelength of 248 nm), and ArF excimer laser (a wavelength of 193 nm), or may be YAG laser (a triple wave) (a wavelength of 355 nm), YAG laser (a quadruple wave) (a wavelength of 266 nm), and the like, which are other UV laser beams. The same applies to laser used hereinafter.

When the carrier 28 is removed from the cured layer 26a, the carrier 28 may be removed by applying the laser light such that peeling energy for peeling off the carrier 28 is 1 kW/cm² or more and 200 kW/cm² or less. In this case, since the carrier can be removed with low energy, it is possible to minimally suppress a heat damage to the semiconductor element 10 or the like, and to minimally suppress the dust generated after the laser irradiation. In addition, since the laser to be applied has low energy, it is possible to shorten the time for removing the carrier.

In the carrier removing step described above, a method for peeling off the carrier by the laser light is used, but a method for removing the carrier is not limited thereto. For example, the carrier 28 may be scraped from the cured layer 26a, or the carrier 28 or the like may be dissolved (melted) in a predetermined solvent. In such a removing step, the cured layer 26a may be removed together. After such a removing step, the exposed surface of the cured layer 26a, or the exposed surface of the encapsulant material layer 24 of the encapsulant material in a case where the cured layer 26a is removed may be cleaned by a predetermined method. Accordingly, it is possible to make the surface side of the semiconductor device 1 that is the final product cleaner. In a case where the carrier 28 is removed by such a method, the carrier 28 may be a light transmissive substrate, and the curable bonding adhesive layer 26 may not contain the light absorbing agent.

Figure 4B:
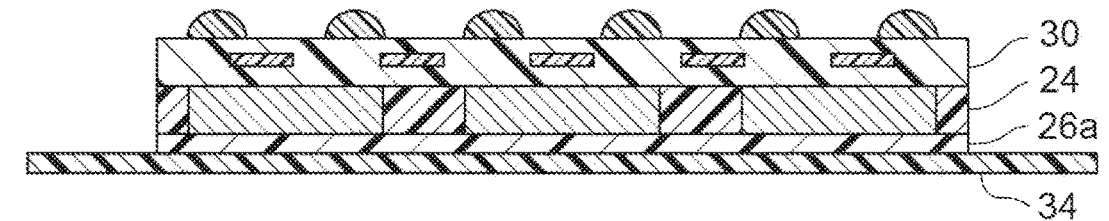
Figure 4C:
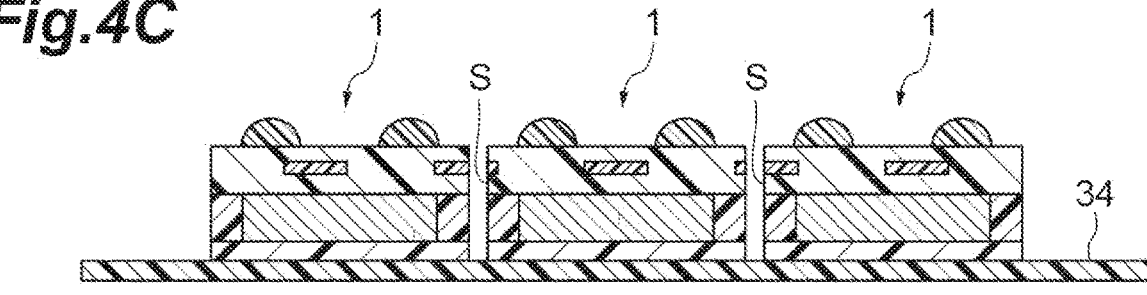
Figure 4D:
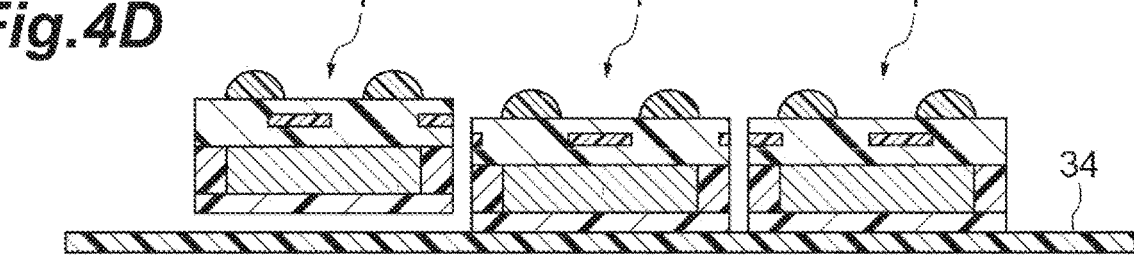
Figure 4E:
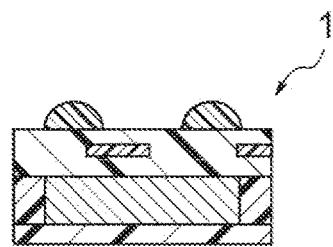

Subsequently, in a case where the removing of the carrier 28 is ended, as illustrated in FIG. 4B, a dicing tape 34 is attached to the exposed surface side of the cured layer 26a to be a wafer-shaped or panel-shaped die redisposition body. Then, as illustrated in FIG. 4C and FIG. 4D, each portion including the semiconductor element 10 is singulated by dicing the die redisposition body at a predetermined spot S to be each of the semiconductor devices 1. Accordingly, it is possible to obtain a plurality of semiconductor devices 1 illustrated in FIG. 4E and FIG. 1 from the die redisposition body in which the plurality of semiconductor elements 10 are redisposed. When the singulating is performed, the cured layer 26a is singulated together with the semiconductor elements thereby the semiconductor device 1 is acquired from each of the plurality of semiconductor elements 10 in which the second surface 10b is protected with the cured layer 26a.

Here, a function effect of the method for manufacturing the semiconductor device 1 according to this embodiment will be described in contrast to a method of Comparative Example. FIGS. 5A-5E to FIGS. 7A-7D are diagrams sequentially describing a method (face-down, without a support plate) for manufacturing a semiconductor device having a fan-out structure. The method illustrated in FIGS. 5A-5E to FIGS. 7A-7D, and the contrast thereto will be described.

Figure 5A:
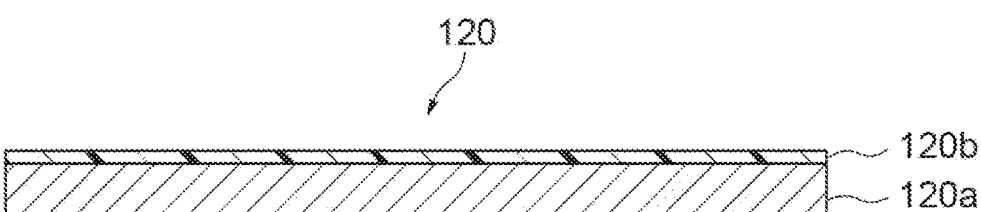
FIGS. 5A to 5E are diagrams illustrating a part of a method (face-down, without a support plate) for manufacturing a semiconductor device.
Figure 5B:
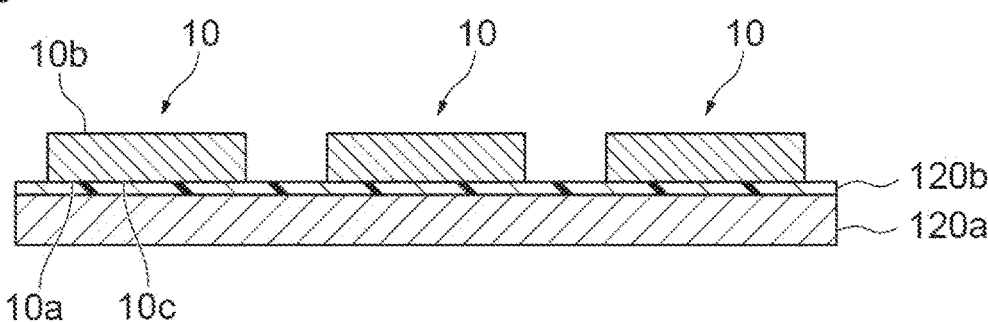

As illustrated in FIG. 5A, in the method of Comparative Example, first, an adhesive layer 120b is provided on a metallic carrier 120a to prepare a temporary fixing material 120. As the adhesive layer 120b, for example, a peeling sheet having an adhesive force at an ordinary temperature, in which the adhesive force is decreased by heating, and the like can be used. Then, as illustrated in FIG. 5B, the plurality of semiconductor elements 10 are disposed on the adhesive layer 120b such that the first surfaces 10a of the plurality of semiconductor elements 10 are directed toward the adhesive layer 120b (that is, face-down). After that, as illustrated in FIG. 5C, an encapsulant material layer 124 is formed by encapsulating the semiconductor elements 10 with the encapsulant material, and in a case where the encapsulating is ended, the adhesive layer 120b is peeled off from the semiconductor elements 10 by heating the adhesive layer 120b or the like to remove the carrier 120a (refer to FIG. 5D).

Figure 5C:
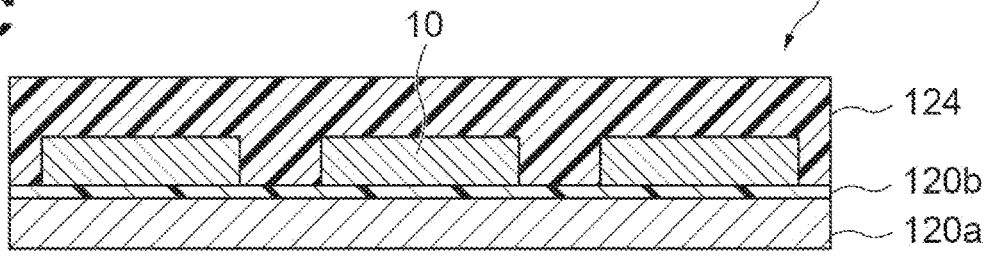
Figure 5D:
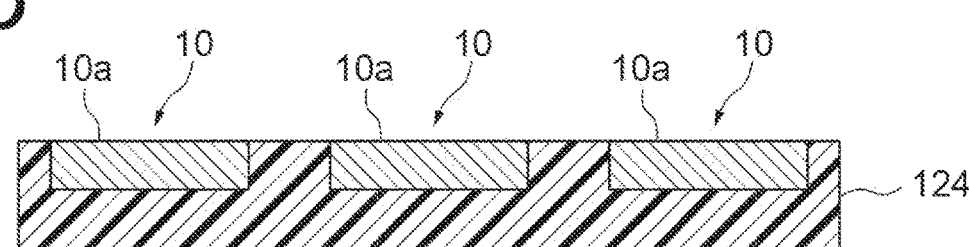
Figure 5E:
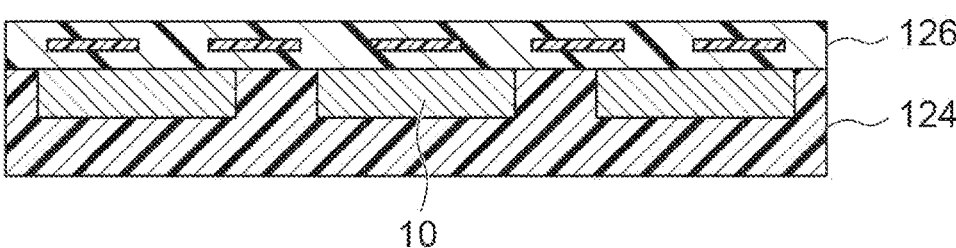

Subsequently, as illustrated in FIG. 5E, a re-distribution layer 126 is formed on the first surfaces 10a on a side to which the semiconductor elements 10 are exposed in the encapsulant material layer 124. After that, as illustrated in FIG. 6A, solder balls 128 are formed on the re-distribution layer 126.

Figure 7A:
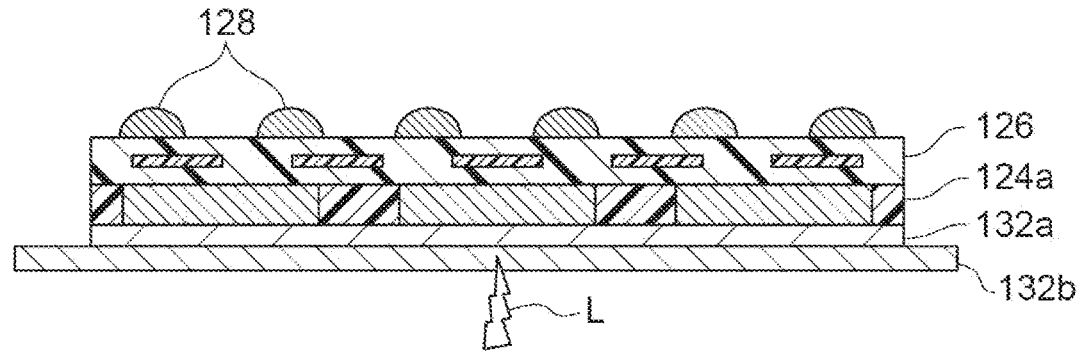
FIGS. 7A to 7D are diagrams illustrating steps that are the method for manufacturing a semiconductor device and are subsequently performed after the steps of FIGS. 6A-6E.
Figure 7B:
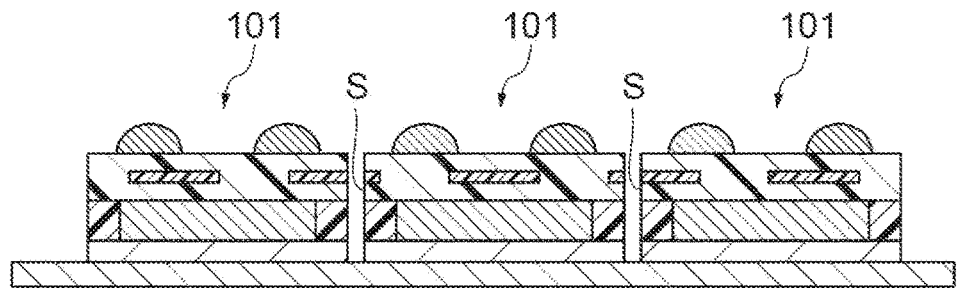
Figure 7C:
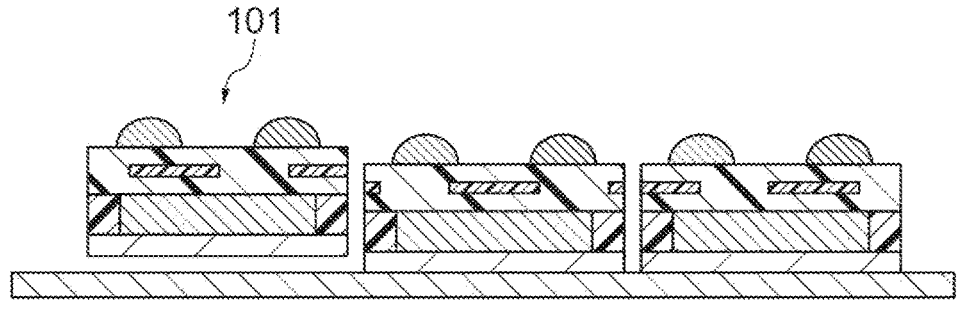
Figure 7D:
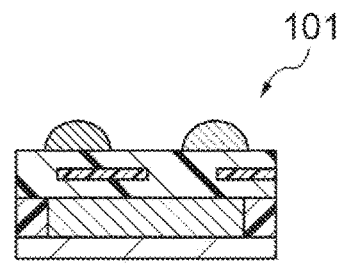

Subsequently, in a case where the solder balls 128 are formed, as illustrated in FIG. 6B, a protective tape 130 (a BG tape) protecting the solder balls 128 is further pasted. The protective tape 130, for example, contains polyolefin. Then, as illustrated in FIG. 6C, in a state where the solder balls 128 are protected with the protective tape 130, the encapsulant material layer 124 from which the second surfaces 10b of the semiconductor elements 10 are exposed is ground to be an encapsulant material layer 124a. After that, as illustrated in FIG. 6D and FIG. 6E, a dicing tape 132b is attached through a BSC film 132a, and in such a state, a step of removing the protective tape 130 is performed. The BSC film 132a, for example, contains an epoxy resin. As the BSC film 132a and the dicing tape 132b, an integrated tape 132 is used. Then, in a case where the removing of the protective tape 130 is ended, as illustrated in FIG. 7A, the laser marking is performed with respect to the BSC film 132a by the laser light to write necessary information such as a product name. The BSC film 132a configures a part of the semiconductor device. After that, as illustrated in FIG. 7B to FIG. 7D, each portion including the semiconductor element 10 is singulated by dicing to obtain each semiconductor device 101.

As described above, in the method according to Comparative Example, the temporary fixing material 120 does not have heat resistance and chemical resistance, and thus, as illustrated in FIG. 5C and FIG. 5D, the temporary fixing material 120 is removed from the die redisposition body in which the semiconductor elements 10 are encapsulated with the encapsulant material in the early stage. When such removing is performed, the opposite surface of the encapsulant material layer 124 or the like is not fixed by the carrier or the like, and thus warpage or distortion may occur by heat or a force when the removing is performed. In a case where the re-distribution layer 126 is attempted to be formed on the encapsulant material layer 124 in which such warpage or the like occurs, it may be difficult to form a fine wiring layer since there is the warpage or the like. In contrast, in the method according to this embodiment, as illustrated in FIG. 3A and FIG. 3B, the other surface of the encapsulant material layer 24 is fixed by the carrier 28. Therefore, according to the manufacturing method of this embodiment, it is possible to reduce the warpage or the distortion when the temporary fixing material 20 is removed, and to increase the flatness of the die redisposition body, compared to the method of Comparative Example. As a result thereof, according to such a manufacturing method, in a case where the re-distribution layer 30 is attempted to be formed on the encapsulant material layer 24, it is possible to form a fine wiring layer.

In the method of Comparative Example, as illustrated in FIG. 5D to FIG. 6B, the back surface (for example, the encapsulant material layer 124) of the die redisposition body in which the plurality of semiconductor elements 10 are disposed is an epoxy resin and remains exposed, contamination may occur in the step. In addition, a resin component of epoxy may be eluted by chemicals used in the step, and in this case, a yield ratio of the copper wiring or the like by a plating step (wiring formation) in the re-distribution layer 126 may be affected. In contrast, in the method according to this embodiment, as illustrated in FIG. 3D and FIG. 3E, in each step, the back surface of the die redisposition body is continuously covered with the carrier 28, it is possible to prevent the contamination or the elution described above. That is, according to the method of this embodiment, it is possible to maintain a step of manufacturing the semiconductor device 1 in the state of high cleanliness.

In the method of Comparative Example, as illustrated in FIG. 5E to FIG. 6C, the back surface of the die redisposition body in which the semiconductor elements 10 are redisposed is the epoxy resin, which may cause contamination in the device environment or the like, and thus it is necessary to provide the device or the like separately from a case, a manufacturing device, and a conveyance/suction mechanism used for manufacturing a fan-in wafer level package (WLP) of which the back surface is silicon or the like. In contrast, in the manufacturing method according to this embodiment, as illustrated in FIG. 3D and FIG. 3E, in each step, the back surface of the die redisposition body is covered with the carrier 28 containing glass or the like, and thus it is possible to prevent the contamination or the like described above. As a result thereof, according to the manufacturing method of this embodiment, it is possible to manufacture the semiconductor device having a fan-out structure, such as FO-WLP, by using the same manufacturing facility or the like as that for the fan-in WLP.

In the method of Comparative Example, as illustrated in FIG. 6B and FIG. 6C, in order to protect the solder balls 128 when the encapsulant material layer 124 is ground such that the second surfaces 10b of the semiconductor elements 10 are exposed, the protective tape 130 is further used. In contrast, in the manufacturing method according to this embodiment, as illustrated in FIG. 2B to FIG. 2D, when the semiconductor elements 10 are encapsulated with the encapsulant material, the encapsulant material layer 24 is set in advance to have a predetermined thickness, and then, the curable bonding adhesive layer 26 is formed. Therefore, according to the manufacturing method of this embodiment, it is possible to decrease the number of members to be used, to decrease the number of steps of attaching each of the members and removing steps thereof, and to simplify a process of manufacturing the semiconductor device 1, compared to the method of Comparative Example.

In the method of Comparative Example, as illustrated in FIG. 6D, the integrated tape 132 may be used in which the dicing tape 132b and the BSC film 132a are integrated after grinding. Such an integrated tape 132 may not have sufficient adhesive residue, dicing properties, pick-up properties, and the like, and it is difficult to reduce the height of the semiconductor device 1. In contrast, in the method according to this embodiment, as illustrated in FIG. 3A, the curable bonding adhesive layer 26 used for fixing the semiconductor element 10 to the carrier 28 is used as it is in the semiconductor device 1, and thus it is not necessary to use such an integrated product, and it is possible to use an individual dicing tape. Accordingly, it is possible to reduce the height of the semiconductor device by using a dicing tape suitable for reducing the height.

As described above, in the manufacturing method according to this embodiment, it is possible to simplify the steps of manufacturing the semiconductor device 1 having a fan-out structure, compared to the method of Comparative Example. In addition, by suppressing the warpage or the distortion of the encapsulant material layer 24 in which the semiconductor elements 10 are encapsulated, it is possible to improve the flatness, and to construct the fine re-distribution layer 30. Further, the fine re-distribution layer 30 can be constructed, and thus it is also possible to reduce the height of the semiconductor device 1.

In the manufacturing method according to this embodiment, a bonding adhesive strength between the cured curable bonding adhesive layer (the cured layer 26a) and the encapsulant material layer 24 may be 4.0 MPa or more. In this case, it is possible to keep the bonding adhesive strength between the cured layer 26a and the encapsulant material layer 24 strong, to prevent peeling after package assembly, and to allow the cured layer 26a to function as it is as a part (the protective layer 12) of the final product of the semiconductor device 1. In this case, the bonding adhesive strength between the cured layer 26a and the encapsulant material layer 24 may be 8.0 MPa or less. The bonding adhesive strength between the cured layer 26a and the encapsulant material layer 24 may be 20 MPa or more. In this case, it is possible to keep the bonding adhesive strength between the cured layer 26a and the encapsulant material layer 24 stronger, to prevent the peeling after the package assembly, and to allow the cured layer 26a to function as it is as a part (the protective layer 12) of the final product of the semiconductor device 1.

In the manufacturing method according to this embodiment, a bonding adhesive strength between the cured curable bonding adhesive layer (the cured layer 26a) and the plurality of semiconductor elements 10 may be 4.0 MPa or more. In this case, it is possible to keep the bonding adhesive strength between cured layer 26a and the plurality of semiconductor elements 10 (for example, silicon chips) strong, to prevent the peeling after the package assembly, and to allow the cured layer 26a to function as it is as a part of the final product of the semiconductor device 1.

In the manufacturing method according to this embodiment, the semiconductor device 1 in a state where the cured curable bonding adhesive layer (the cured layer 26a) protects the second surface 10b of each of the plurality of semiconductor elements 10 may be acquired. In this case, it is possible to allow the cured layer 26a used in the manufacturing to function as it is as a part (the protective layer 12) of the final product of the semiconductor device 1.

The embodiment of the present disclosure has been described in detail, but the present disclosure is not limited to the embodiment described above, and can be applied to various embodiments. For example, in the embodiment described above, the method for manufacturing the semiconductor device 1 including the semiconductor element 10 is described, but the present disclosure may be applied to a method for manufacturing a semiconductor device or a device including a plurality of electronic components in addition to or instead of the semiconductor elements 10. In this case, in the attaching step illustrated in FIG. 2B, the plurality of electronic components are attached to the temporary fixing material 20 together with the plurality of semiconductor elements 10, in the step illustrated in FIG. 2C, the plurality of electronic components are encapsulated with the encapsulant material together with semiconductor elements 10, and in the steps illustrated in FIG. 2D and FIG. 3A, the plurality of electronic components are fixed to the carrier 28 by curing the curable bonding adhesive layer 26 together with the semiconductor elements 10. The other steps can be the same as the steps described above. According to such a manufacturing method, it is possible to form a more complicated semiconductor device or the like. Here, the electronic component, for example, may be a passive element such as a capacitor or a resistor, or may be a component such as MEMS.

Examples

Hereinafter, the present invention will be described in more detail by using Examples. Here, the present invention is not limited to such examples. In the following examples, the bonding adhesive strength between the curable bonding adhesive layer 26 (the cured layer 26a after curing, and the protective layer 12) and the encapsulant material layer 24, used in the method for manufacturing a semiconductor device according to the embodiment described above, and the peeling energy for the glass substrate (the carrier 28) from the cured layer 26a will be described. The bonding adhesive strength between the cured layer 26a and the encapsulant material layer 24 can be applied to the bonding adhesive strength between the cured layer 26a and the semiconductor elements 10.

As raw materials for the curable bonding adhesive layer, the followings were prepared.

[Thermoplastic Resin]

Acrylic polymer having epoxy group: (Glass transition temperature: 12° C.)

[Epoxy Resin]

Bisphenol F-Type liquid epoxy resin: YDF-8170C (Product name, manufactured by NIPPON STEEL Chemical & Material Co., Ltd.)

Cresol novolac-type epoxy resin: N-500P-10 (Product name, manufactured by DIC Corporation)

[Curing Agent]

Phenolic resin: PSM-4326 (Product name, manufactured by Gun Ei Chemical Industry Co., Ltd.)

Phenolic resin: MEH-7800M (Product name, manufactured by Meiwa Plastic Industries, Ltd.)

[Silica Filler]

SC2050-HLG (Product name, manufactured by ADMATECHS COMPANY LIMITED)

R972 (Product name, manufactured by NIPPON AEROSIL CO., LTD.)

[Light Absorbing Agent]

Carbon black: FP-Black (Product name, manufactured by SANYO COLOR WORKS, Ltd.)

[Coupling Agent]

(3-mercaptopropyl) trimethoxysilane: A-189 (Product name, manufactured by Momentive Performance Materials)

3-ureidopropyl triethoxysilane: A-1160 (Product name, manufactured by Momentive Performance Materials)

[Curing Accelerator]

1-cyanoethyl-2-phenylimidazole: 2PZ-CN (Product name, manufactured by SHIKOKU CHEMICALS CORPORATION)

Subsequently, as a material used in the curable bonding adhesive layer, a resin varnish containing each raw material at a compound ratio shown in Table 1 described below, and cyclohexanone as a solvent was prepared. The total concentration of components other than the solvent in the resin varnish was 40% by mass, on the basis of the mass of the varnish.

TABLE 1

| | | Curable resin film | |
| --- | --- | --- | --- |
| Raw material | | A | B |
| Thermoplastic resin (Glass transition temperature: 12° C.) | | 15 | 65 |
| Epoxy resin | YDF-8170C | 15 | — |
| | N-500P-10 | 5 | 15 |
| Curing agent | PSM-4326 | 15 | — |
| | MEH-7800M | — | 10 |
| Silica filler | SC2050-HLG | 50 | — |
| | R972 | — | 10 |
| Light absorbing agent | FP-Black | 3 | 3 |
| Coupling agent | A-189 | 0.1 | 0.4 |
| | A-1160 | 0.3 | 1.1 |
| Curing accelerator | 2PZ-CN | 0.05 | 0.03 |

A support film was coated with each varnish, and the coated film was dried to form a curable resin film on the support film. A protective film was placed on the curable resin film, and a film A or B including the support film, the curable resin film, and the protective film was obtained. The thickness of the curable resin film when cured was 20 μm.

[Evaluation of Adhesiveness to Encapsulant Material]

A glass substrate having a 12-inch size (a thickness of 700 μm) was cut out into a 9 mm×9 mm size by using a blade dicer (Product Name, DAD3360, manufactured by DISCO Corporation). The protective film was peeled off from the film A or the film B, and the exposed curable resin film of the film A or the film B was placed on the glass substrate having a 9 mm×9 mm size, and the curable resin film and the glass substrate were attached by using a vacuum laminator (Product Name, V-130, manufactured by Nikko-Materials Co., Ltd.). The condition of the vacuum laminator was set to an upper platen temperature of 90° C., a lower platen temperature of 40° C., a pressure of 0.5 MPa, and a pressurization time of 60 seconds.

Subsequently, in a case where the attaching was ended, the curable resin film was cured in each condition by using an atmospheric oven (Product Name, PHH-202, manufactured by ESPEC CORP.) or a nitrogen oven (Product Name, CLH-21CD, manufactured by KOYO THERMO SYSTEMS CO., LTD.). An encapsulating body (the encapsulant material layer) was formed on the protective layer that is the cured curable resin film by using an encapsulant material (Product Name, CEL-400ZHF40, manufactured by Showa Denko Materials Co., Ltd.) and a molding device (Product Name, ADM-12, manufactured by MEMO CO., LTD.). A bonding adhesive area between the encapsulating body and the protective layer was 10 mm². The condition of the molding device was set to an encapsulating temperature of 130° C. and a curing time of 600 seconds. The encapsulating body formed by using the oven was heated to 175° C. for 4 hours such that the encapsulating body was further cured. Accordingly, a laminated body for evaluation including the glass substrate, the protective layer, and the encapsulating body was obtained.

Next, a shear jig was scanned in parallel to the main surface of the glass substrate by using a bond tester (Product Name, System650, manufactured by Royce Instruments, Inc.), and a shear stress obtained by cutting off the formed encapsulating body was measured as a bonding adhesive strength between the encapsulating body and the protective layer. The bonding adhesive area between the encapsulating body and the protective layer was set to 10 mm², a manipulation rate of the shear jig was set to 50 μm/s, and clearance was set to 100 μm on the basis of the protective layer formed on the glass substrate. The results of the bonding adhesive strength in a curing condition of the protective layer of each example are shown in Table 2 and Table 3. The bonding adhesive strength to the encapsulating body shown in Table 2 and Table 3 described below indicates the average value obtained by performing a test 10 times for each example. The temperature at the time of measuring the bonding adhesive strength was a room temperature (25° C.). The bonding adhesive strength in this specification is measured by the method described above.

TABLE 2

| Item | Example 1 | Example 2 | Example 3 | Example 4 |
|---|---|---|---|---|
| Type of protective layer | A | A | A | A |
| Curing condition of protective layer | 130° C. for 30 minutes 170° C. for 60 minutes Under atmosphere | 170° C. for 60 minutes Under atmosphere | 170° C. for 60 minutes Under nitrogen atmosphere | 200° C. for 60 minutes Under nitrogen atmosphere |
| Bonding adhesive strength to encapsulating body [MPa] | 4.9 | 6.0 | 6.9 | 7.5 |

TABLE 3

| Item | Example 5 | Example 6 | Example 7 | Example 8 |
|---|---|---|---|---|
| Type of protective layer | B | B | B | B |
| Curing condition of protective layer | 130° C. for 30 minutes 170° C. for 60 minutes Under atmosphere | 170° C. for 60 minutes Under atmosphere | 170° C. for 60 minutes Under nitrogen atmosphere | 200° C. for 60 minutes Under nitrogen atmosphere |
| Bonding adhesive strength to encapsulating body [MPa] | 25.3 | 25.4 | 24.0 | 26.0 |

As shown in Table 2 and Table 3 described above, by setting the curing condition of the protective layer to a predetermined range, it was possible to confirm that the cured layer to be the protective layer was capable of adhering to the encapsulant material layer at 4.0 MPa or more. Similarly, it was possible to confirm that the cured layer to be the protective layer was capable of adhering to the encapsulant material layer at 20 MPa or more.

[Laser Peeling Test]

Next, the same film A and film B as those in the tests of Examples 1 to 8 described above were prepared, the curable resin film exposed by peeling off the protective film from the film A or the film B was placed on a glass substrate (60 mm×60 mm, a thickness of 700 µm), and the curable resin film and the glass substrate were attached by a vacuum laminator (Product Name, V-130, manufactured by Nikko-Materials Co., Ltd.). The condition of the vacuum laminator was set to an upper platen temperature of 90° C., a lower platen temperature of 40° C., a pressure of MPa, and a pressurization time of 60 seconds. The curable resin film was cured by heating at 130° C. for 20 minutes, and then, heating at 170° C. for 2 hours using the oven. The encapsulant material layer was formed on the protective layer that is the cured curable resin film in the condition of 150° C. for 300 seconds by using an encapsulant material containing an epoxy resin and a molding device (Product Name, CPM1080, manufactured by TOWA CORPORATION). The formed encapsulant material layer was further cured by heating at 150° C. for 6 hours. Accordingly, a laminated body for evaluation having a three-layer structure, including the glass substrate, the protective layer, and the encapsulant material layer, was obtained.

The laminated body for evaluation was irradiated with UV laser light at a wavelength of 355 nm in a direction perpendicular to the glass substrate to peel off the glass substrate. After the irradiation, a case where the encapsulant material layer with the protective layer and the glass substrate were easily peeled off was evaluated as A, a case where the encapsulant material layer with the protective layer and the glass substrate were peeled off by making a notch with a cutter was evaluated as B, and peeling results in each irradiation condition of the UV laser light were shown in Table 4 and Table 5. By applying the laser light, there was no decrease in the bonding adhesive strength between the protective layer and the encapsulant material layer.

TABLE 4

| Item | | Example 9 | Example 10 | Example 11 | Example 12 |
|---|---|---|---|---|---|
| Type of protective layer | | A | A | A | A |
| Laser peeling test | Peeling energy [kw/cm²] | 18.5 | 46.8 | 73.9 | 100.6 |
| | Output [mW] | 58 | 147 | 232 | 316 |
| | Repetition frequency [KHz] | 76 | 65 | 59 | 55 |
| | Scanning rate [mm/s] | 760 | 650 | 590 | 550 |
| | Pitch [µm] | 9 | 9 | 9 | 9 |
| | Overlap [%] | 50 | 50 | 50 | 50 |
| | Peeling properties | B | A | A | A |

TABLE 5

| Item | | Example 13 | Example 14 | Example 15 |
|---|---|---|---|---|
| Type of protective layer | | B | B | B |
| Laser peeling test | Peeling energy [kw/cm²] | 18.5 | 100.6 | 166.6 |
| | Output [mW] | 58 | 316 | 523 |
| | Repetition frequency [KHz] | 76 | 55 | 47 |
| | Scanning rate [mm/s] | 760 | 550 | 470 |
| | Pitch [µm] | 9 | 9 | 9 |
| | Overlap [%] | 50 | 50 | 50 |
| | Peeling properties | B | B | A |

As shown in Table 4 and Table 5 described above, it was possible to check that peeling was available by setting the peeling energy when peeling off the glass substrate to be the carrier from the encapsulant material layer with the protective layer to 1 kW/cm² or more and 200 kW/cm² or less.

REFERENCE SIGNS LIST

1: semiconductor device, 10: semiconductor element, 10a: first surface, 10b: second surface, 10c: connection terminal, 20: temporary fixing material, 22: temporary fixing structure body, 24: encapsulant material layer, 26: curable bonding adhesive layer, 26a: cured layer, 28: carrier, 30: re-distribution layer, 32: solder ball, 34: dicing tape.

The invention claimed is:

1. A method for manufacturing a semiconductor device, comprising:

preparing a temporary fixing structure body in which a plurality of semiconductor elements each including a first surface on which a connection terminal is formed and a second surface on a side opposite to the first surface are attached to a temporary fixing material, in the temporary fixing structure body, the plurality of semiconductor elements being attached onto the temporary fixing material such that the first surface of each of the plurality of semiconductor elements is directed toward the temporary fixing material, and the plurality of semiconductor elements being encapsulated with an encapsulant material such that the second surface of each of the plurality of semiconductor elements is exposed from an encapsulant material layer, forming a curable bonding adhesive layer on the second surface of each of the plurality of semiconductor elements;

attaching a carrier to one surface of the curable bonding adhesive layer on a side opposite to the plurality of semiconductor elements;

fixing the plurality of semiconductor elements to the carrier by curing the curable bonding adhesive layer through the cured curable bonding adhesive layer;

removing the temporary fixing material;

forming a re-distribution layer on the first surface of each of the plurality of semiconductor elements in a state in which the plurality of semiconductor elements are fixed to the carrier; and removing the carrier after forming the re-distribution layer, wherein the carrier is removed from the cured curable bonding adhesive layer.

2. The method for manufacturing a semiconductor device according to claim 1, wherein the carrier is a glass substrate, and wherein a bonding adhesive strength of the curable bonding adhesive layer to the glass substrate is 1 MPa or more when the curable bonding adhesive layer is cured, and is 5 MPa or less when the curable bonding adhesive layer is irradiated with laser.

3. The method for manufacturing a semiconductor device according to claim 1, wherein the curable bonding adhesive layer includes a resin composition containing a thermoplastic resin and an epoxy curing agent, and a glass transition temperature of the thermoplastic resin is −40° C. or higher and 40° C. or lower.

4. The method for manufacturing a semiconductor device according to claim 1, wherein a thickness of the curable bonding adhesive layer is 1 μm or more and 400 μm or less after curing.

5. The method for manufacturing a semiconductor device according to claim 1, wherein the carrier is a glass substrate or a transparent resin substrate, and a thickness thereof is 0.1 mm or more and 2.0 mm or less.

6. The method for manufacturing a semiconductor device according to claim 1, further comprising:

attaching a solder ball to the connection terminal of each of the plurality of semiconductor elements or the re-distribution layer in a state in which the plurality of semiconductor elements are fixed to the carrier.

7. The method for manufacturing a semiconductor device according to claim 1, wherein the carrier is a light transmissive substrate, and wherein, in the removing of the carrier, the carrier is removed by irradiating the cured curable bonding adhesive layer with laser light from the carrier side.

8. The method for manufacturing a semiconductor device according to claim 1, wherein, in the removing of the carrier, the carrier is removed by applying laser light such that peeling energy for peeling off the carrier is 1 kW/cm$^2$ or more and 200 kW/cm$^2$ or less.

9. The method for manufacturing a semiconductor device according to claim 1, wherein, in the removing of the carrier, the carrier is removed by scraping or melting the carrier.

10. The method for manufacturing a semiconductor device according to claim 1, further comprising:

cleaning an exposed surface of either the cured curable bonding adhesive layer or the encapsulant material layer of the encapsulant material after the removing of the carrier.

11. The method for manufacturing a semiconductor device according to claim 1, further comprising:

singulating the plurality of semiconductor elements after the removing of the carrier.

12. The method for manufacturing a semiconductor device according to claim 11, wherein, in the singulating of the plurality of semiconductor elements, the cured curable bonding adhesive layer is singulated together with the plurality of semiconductor elements, and wherein, the semiconductor device is acquired from each of the plurality of semiconductor elements in which the second surface is protected with the curable bonding adhesive layer.

13. The method for manufacturing a semiconductor device according to claim 1, wherein the preparing of the temporary fixing structure body includes;

preparing the temporary fixing material;

attaching the plurality of semiconductor elements to the temporary fixing material such that the first surface of each of the plurality of semiconductor elements is directed toward the temporary fixing material; and encapsulating the plurality of semiconductor elements with the encapsulant material such that the second surface of each of the plurality of semiconductor elements attached to the temporary fixing material is exposed from the encapsulant material layer.

14. The method for manufacturing a semiconductor device according to claim 1, wherein, in the preparing of the temporary fixing structure body, the temporary fixing structure body in which a plurality of electronic components are attached to the temporary fixing material together with the plurality of semiconductor elements is prepared, and wherein, in the fixing of the plurality of semiconductor elements, the plurality of electronic components are fixed to the carrier by curing the curable bonding adhesive layer.

15. The method for manufacturing a semiconductor device according to claim 1, wherein a bonding adhesive strength between the cured curable bonding adhesive layer and the encapsulant material is 4.0 MPa or more.

16. The method for manufacturing a semiconductor device according to claim 1, wherein the bonding adhesive strength between the cured curable bonding adhesive layer and the encapsulant material is 8.0 MPa or less.

17. The method for manufacturing a semiconductor device according to claim 1, wherein a bonding adhesive strength between the cured curable bonding adhesive layer and the encapsulant material is 20 MPa or more.

18. The method for manufacturing a semiconductor device according to claim 1, wherein a bonding adhesive strength between the cured curable bonding adhesive layer and the plurality of semiconductor elements is 4.0 MPa or more.

19. The method for manufacturing a semiconductor device according to claim 1, wherein the semiconductor device in a state in which the cured curable bonding adhesive layer protects the second surface of each of the plurality of semiconductor elements is acquired.

* * * * *